(12) United States Patent
Shin et al.

(10) Patent No.: US 9,431,438 B2
(45) Date of Patent: Aug. 30, 2016

(54) DISPLAY DEVICE AND METHOD FOR FABRICATING THE SAME

(71) Applicant: LG DISPLAY CO., LTD., Seoul (KR)

(72) Inventors: MiHee Shin, Goyang-si (KR); TaeSang Kim, Cheonan-si (KR); MinGyeong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/847,846

(22) Filed: Sep. 8, 2015

(65) Prior Publication Data

US 2016/0141315 A1    May 19, 2016

(30) Foreign Application Priority Data

Nov. 14, 2014  (KR) .......................... 10-2014-0159150

(51) Int. Cl.
| | |
|---|---|
| *H01L 29/78* | (2006.01) |
| *H01L 27/12* | (2006.01) |
| *H01L 29/66* | (2006.01) |
| *H01L 29/786* | (2006.01) |
| *H01L 21/4763* | (2006.01) |

(52) U.S. Cl.
CPC ..... *H01L 27/1296* (2013.01); *H01L 21/47635* (2013.01); *H01L 27/124* (2013.01); *H01L 29/66969* (2013.01); *H01L 29/7869* (2013.01)

(58) Field of Classification Search
CPC ........................................................ H01L 27/124
USPC ............................................................ 257/43
See application file for complete search history.

(56) References Cited

U.S. PATENT DOCUMENTS

2005/0110924 A1*  5/2005  Kim ...................... G02F 1/1393
                                                               349/111

FOREIGN PATENT DOCUMENTS

JP           2-106722 A        4/1990

* cited by examiner

*Primary Examiner* — Tran Tran
(74) *Attorney, Agent, or Firm* — Birch, Stewart, Kolasch & Birch, LLP

(57) ABSTRACT

A display device according to an embodiment includes a plurality of driving blocks including a plurality of gate lines and a gate shorting structure spaced apart from the gate lines by an amount equal to a trimming region; an equipotential line extending from one of the driving blocks to an adjacent driving block, part of which is removed by the amount equal to the trimming region; a gate dummy line extending from at least one of the driving blocks; a plurality of data lines intersecting the gate lines; and an active layer disposed between the gate dummy line and the data lines, wherein some part of the active layer that overlaps the gate dummy line but does not overlap the data lines is removed.

15 Claims, 13 Drawing Sheets

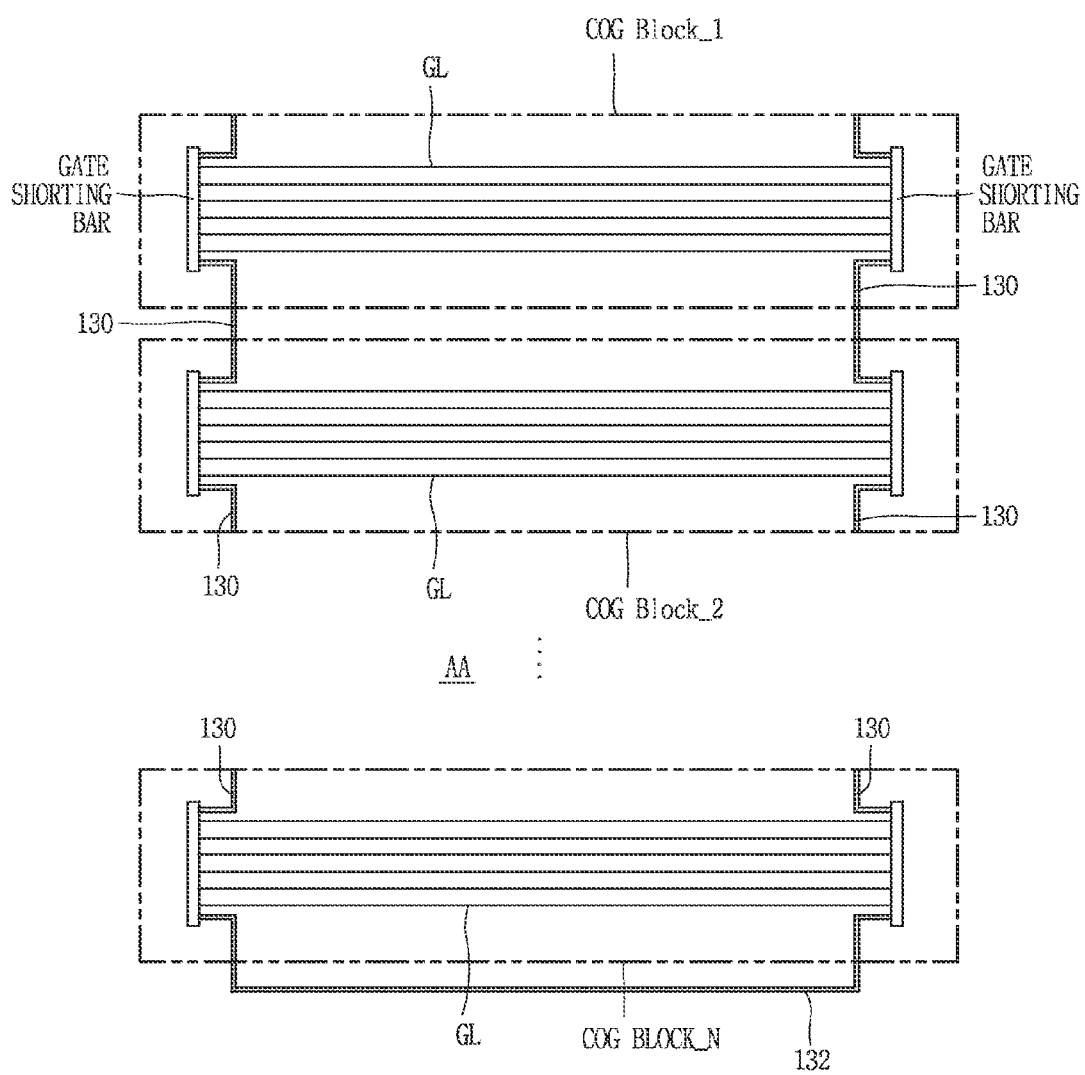

FIG. 9A
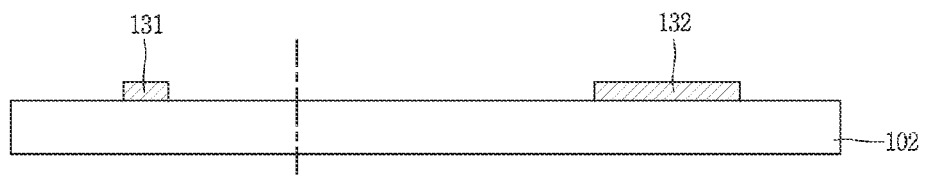
FIG. 9B
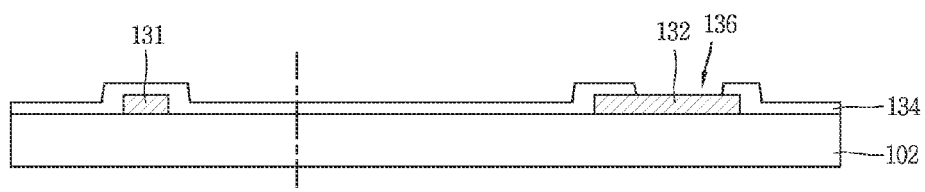
FIG. 9C
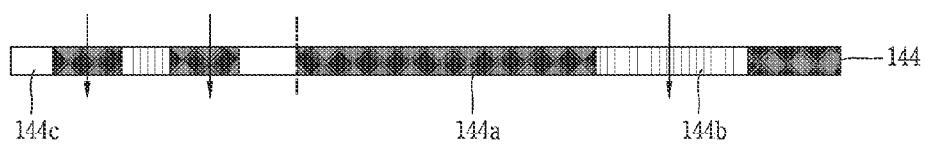
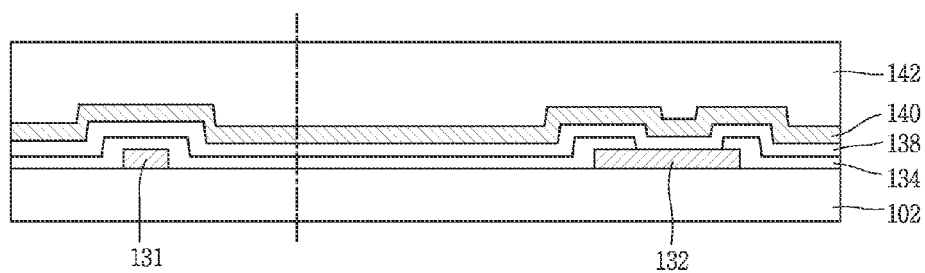

DISPLAY DEVICE AND METHOD FOR FABRICATING THE SAME

CROSS-REFERENCE TO RELATED APPLICATION

Pursuant to 35 U.S.C. §119(a), this application claims the benefit of earlier filing date and right of priority to Korean Application No. 10-2014-0159150, filed on Nov. 14, 2014, the contents of which is incorporated by reference herein in its entirety.

BACKGROUND OF THE INVENTION

1. Field of the Invention

The present invention relates to a display device, and more particularly, to a display device that is designed to prevent defects caused by static electricity generated during the fabrication process of a display device or by a current applied during inspection.

2. Description of the Background Art

Various electrical equipment provides various information to a user by using flat panel display devices such as a liquid crystal display device, a plasma display panel device, a field emission device, an electrophoretic display device, and an organic light emitting diode display device.

Display devices convert a video signal input from the outside into a data voltage, and displays an image related to the video signal in a plurality of pixels in response to a data voltage. These display devices each include a substrate where thin film transistors (TFT), wiring, and circuitry including pads connected to drive integrated circuits (D-IC) for driving the display device are formed. Such a substrate is referred to as an array substrate or backplane.

Electrical charges may be generated during various steps of a fabrication process of an array substrate for a display device. For example, electrical charges due to frictional electrification may be generated during high-pressure micro jet (HPMJ) cleaning or other various steps of the array substrate fabrication process. Also, static electricity may enter the substrate through various paths during dry etching or other various steps.

The static electricity entering during the process and the electrical charges resulting from the process may be trapped on organic or inorganic layers on the display substrate. As a result, this affects the electrical properties of transistors formed on the array substrate, causing display defects in the display device. Especially in the case of a display device whose active area is divided into a plurality of driving blocks that are driven by a signal from an individual drive integrated chip (D-IC) or a combination of drive integrated chips, various display defects such as horizontal lines may occur because the electrical charges trapped on organic or inorganic layers on the substrate may differ for each driving block.

To avoid such defects, various additional processes may be performed. For example, in the case of a display device including transistors that use a silicon semiconductor as an active material, additional process like hole doping or plastic processing may be performed to improve the device characteristics.

However, in the case of array substrates using oxide semiconductor transistors, which are getting attention in the recent displays, the use of additional processes for stabilizing the device characteristics may be restricted. For example, doping an oxide semiconductor for improvement of the device characteristics may cause a negative shift in threshold voltage. Moreover, the device characteristics stabilization process may cause an oxygen vacancy in the oxide semiconductor because it requires a high temperature.

Therefore, a display device including a plurality of driving blocks, with drive integrated chips (D-IC) bonded directly to a substrate, may suffer from defects due to luminance differences between the driving blocks caused by electrical charges generated or entering during the fabrication process of the display device.

Moreover, a charge difference is generated between gate lines and data lines because the gate lines and the data lines are separated from each other, and this increases the possibility of leaving floating impurities or organic impurities on top of the gate lines or on overlapping portions between the gate lines and the data lines or overlapping portions between the gate lines and source/drain electrodes.

SUMMARY OF THE INVENTION

The present invention has been made in an effort to solve the aforementioned problems, and an aspect of the present invention is to provide a display device which uses a new structure for overcoming or minimizing defects in the display device, caused by a current entering the display device during the fabrication and inspection processes of the display device, and a method for fabricating the same.

An exemplary embodiment of the present invention provides a method for fabricating a display device, the method including: forming a plurality of driving blocks including a plurality of gate lines and a gate shorting structure connected to the plurality of gate lines on a substrate; forming a first equipotential line that connects adjacent driving blocks to create an equipotential between the driving blocks; forming a gate dummy line extending from at least one of the plurality of driving blocks; forming an active layer and a plurality of data line on the gate dummy line; exposing some part of the active layer overlapping the gate dummy line by removing part of the plurality of data lines; forming a second equipotential line that creates an equipotential between the gate lines and the data lines by making part of the exposed active layer conductive; eliminating the equipotential between the plurality of driving blocks by removing part of the first equipotential line and part of plurality of the gate lines as trimming region; and eliminating the equipotential between the plurality of gate lines and the plurality of data lines by removing part of the second equipotential line.

In the method according to this exemplary embodiment of the present invention, the forming of the first equipotential line and the forming of the gate dummy line may be performed simultaneously.

In the method according to this exemplary embodiment of the present invention, part of the first equipotential line and part of the plurality of gate lines may be removed by a laser trimming process.

In the method according to this exemplary embodiment of the present invention, the active layer may be made of an oxide semiconductor material.

In the method according to this exemplary embodiment of the present invention, the second equipotential line may be formed by making part of the exposed active layer conductive through plasma treatment.

Another exemplary embodiment of the present invention provides a display device including: a plurality of driving blocks including a plurality of gate lines and a gate shorting structure spaced apart from the gate lines as a trimming region; an equipotential line extending from one of the plurality of driving blocks to an adjacent driving block, part of which is removed as the trimming region; a gate dummy line extending from at least one of the plurality of driving blocks; a plurality of data lines intersecting the plurality of gate lines; and an active layer between the gate dummy line and the plurality of data lines, wherein some part of the active layer that overlaps the gate dummy line but does not overlap the plurality of data lines is removed.

In the display device according to this exemplary embodiment of the present invention, the equipotential line may be made of the same material as the plurality of gate lines.

In the display device according to this exemplary embodiment of the present invention, the plurality of driving blocks may be insulated from each other.

In the display device according to this exemplary embodiment of the present invention, the plurality of data lines may be insulated from the gate dummy line.

In the display device according to this exemplary embodiment of the present invention, the active layer may be made of an oxide semiconductor material.

In the display device according to this exemplary embodiment of the present invention, the removed part of the active layer may be an conductive portion of the active layer.

According to the embodiments of the present invention, an equipotential is created between driving blocks by connecting the driving blocks by equipotential lines, the driving blocks including a gate shorting structure or other similar structures, for example, gate shorting bars, for connecting a plurality of gate lines and a plurality of data lines. Thus, any charge difference between the driving blocks that may be generated during the fabrication process or inspection process can be reduced, thereby allowing the thin film transistors of the display device to have more uniform device characteristics.

Furthermore, according to the embodiments of the present invention, an equipotential is created between a plurality of gate lines and a plurality of data lines by bringing a gate dummy line extending from the gate shorting bars of the last driving block and the data lines into contact with each other by using a conductive active layer portion. Thus, the charge difference between the gate lines and the data lines can be reduced, and this decreases the possibility of leaving floating impurities or organic impurities on top of the gate lines or on overlapping portions between the gate lines and the data lines or overlapping portions between the gate lines and the source/drain electrodes during the fabrication process.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

FIG. 3 is a schematic view of a structure of a display device according to one exemplary embodiment of the present invention, the display device including a first equipotential line connecting gate shorting bars for connecting a plurality of gate lines within driving blocks and a gate dummy line connecting two opposite ends of the gate lines within the last driving block;

FIGS. 9A to 9M are process cross-sectional views schematically showing the formation and separation of a second equipotential line between data lines and a gate dummy line, in a display device according to one exemplary embodiment of the present invention.

DETAILED DESCRIPTION OF THE INVENTION

Figure 1:
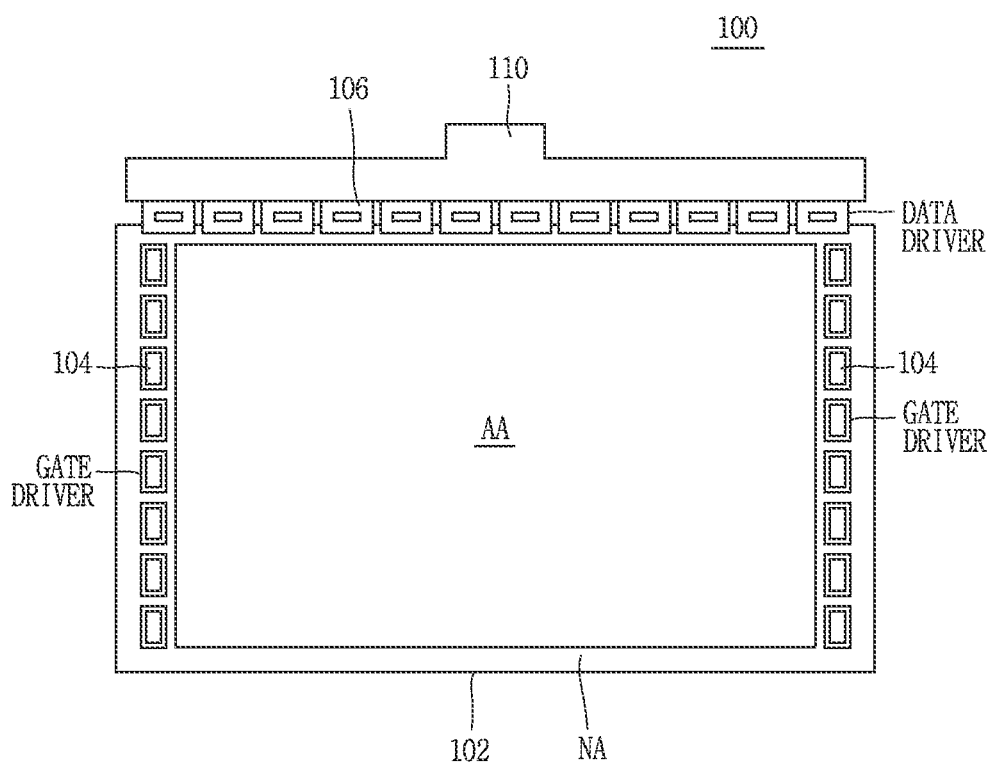
FIG. 1 is a schematic view of a display device according to one exemplary embodiment of the present invention, which depicts a gate COG (Chip on Glass) and a data COF (Chip on Film) mounted on the display device.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the exemplary embodiments set forth herein. Rather, these embodiments are provided so that this disclosure will be thorough and complete and will fully convey the scope of the inventive concept to those skilled in the art, and the present inventive concept will only be defined by the appended claims.

The shapes, dimensions, proportions, angles, figures, numbers, etc disclosed in the drawings to describe the embodiments of the present invention are merely examples and the present invention is not limited thereto. Like reference numerals designate like elements throughout the specification. In descriptions of the invention, when it is deemed that detailed descriptions of related well-known technology may unnecessarily obscure the gist of the invention, detailed description thereof will be omitted. The terms 'include', 'comprise', 'have', and 'consist of' are intended to mean that the parts may include additional sub-parts unless the term "only" is stated. As used herein, the terms "a," "an," and "the" are to be understood as meaning both singular and plural, unless explicitly stated otherwise.

Although not explicitly stated, the elements may be interpreted with a margin of error.

When the position relation between two parts is described using the terms 'on', 'above', 'below', 'next', and the like, one or more parts may be positioned between the two parts as long as the term 'immediately' or 'directly' is not used.

It will be understood that when an element or layer is referred to as being "on" another element or layer, the element or layer can be directly on another element or layer or intervening elements or layers.

While terms such as 'first', 'second', etc. may be used to describe various components, such components must not be understood as being limited to the above terms. The above terms are used only to distinguish one component from another. For example, a first component may be referred to as a second component without departing from the scope of rights of the present invention.

Like reference numerals designate like elements throughout the specification.

In the drawings, the sizes and thicknesses of the components are merely shown for convenience of explanation, and therefore the present invention is not necessarily limited to the illustrations described and shown herein.

The components of various embodiments of the present invention can be partially or entirely bonded to or combined with each other and can be interlocked and operated in technically various ways as can be fully understood by an ordinary person skilled in the art, and the embodiments can be carried out independently of or in association with each other.

Hereinafter, specific details for carrying out the embodiments of the present invention will be described with reference to the accompanying drawings.

FIG. 1 is a schematic view of a display device according to one exemplary embodiment of the present invention, which depicts a gate COG (Chip on Glass) and a data COF (Chip on Film) mounted on the display device. The display device in all of the embodiments of the present invention are operatively coupled and configured.

A display device 100 according to one exemplary embodiment of the present invention may be configured as a liquid crystal display including a liquid crystal element or an organic light emitting display including an organic light emitting element. Besides, the display device 100 may be configured as an electrophoretic display, as well as a liquid crystal display device or an organic light emitting display.

If the display device 100 is configured as a liquid crystal display, it may be embodied in a TN (Twisted Nematic) structure, VA (Vertical Alignment) structure, an IPS (In Plane Switching) structure, an FFS (Fringe Field Switching) mode, or an ECB (Electrically Controlled Birefringence) structure. If the display device 100 is configured as an organic light emitting display, it may be embodied in a top-emission structure, a bottom-emission structure, or a dual-emission structure.

A substrate 102 of the display device 100 may be divided into an active area AA for displaying an image and a non-active area NA. A plurality of subpixels for light control are formed in the active area AA to display an image. Each subpixel includes a transistor connected to a gate line GL and a data line DL, a capacitor that stores a data signal DATA supplied through the transistor as a data voltage, and a pixel circuit that operates in response to the data voltage stored in the capacitor. With the use of the capacitor and a controller, the pixel circuit of each subpixel may be configured in various ways depending on the type, structure, and drive mode of the display device.

The display device 100 includes gate drivers and data drivers, and displays an image by driving the plurality of subpixels in response to a gate signal supplied from the gate drivers and a data signal supplied from the data drivers.

In the exemplary embodiment illustrated in FIG. 1, the gate drivers are configured as gate drive ICs 104 that are positioned in the non-active area NA on two opposite outer sides of the substrate 102 and mounted by a COG (Chip-On-Glass) method.

The data drivers are provided in a COF (Chip-On-Film) type on a flexible circuit board 106 connected to one side of the substrate 102, rather than being directly bonded to and mounted on the substrate 102. Alternatively, the data drivers may be of a COG (Chip-On-Glass) type, without being limited to the COF (Chip-On-Film) type.

In FIG. 1, one side of the flexible circuit board 106 is connected to the substrate 102 and the other side is connected to a printed circuit board 110 where a timing controller, a power supply, etc. are positioned, whereby the substrate 102 and the printed circuit board 110 are electrically connected to send signals between them. That is, the flexible circuit board 106 sends to the gate drivers and the data drivers various signals and power output from the timing controller and power supply formed on the printed circuit board 110. An image processor may be mounted in the form of an IC (integrated circuit) on the printed circuit board 110 or on another circuit board (or system board) connected to the printed circuit board 110, but an illustration thereof will be omitted.

To mount the gate drive ICs 104 on the substrate 102 by bonding them to the substrate 102, a plurality of gate drivers for mounting the gate drive ICs 104 are provided on one side or both sides of the non-active area NA of the substrate 102. Each gate driver includes a plurality of input pads for inputting an external signal into the gate drive IC 104 and a plurality of output pads for outputting a signal from the gate drive IC 104. The input pads and the output pads are electrically connected to bumps of the gate drive IC 104 to input an external signal into the gate drive IC 104 and output a signal from the gate drive IC 104. In this case, an adhesive such as an anisotropic conductive film (ACF) or a non-conductive paste (NCP) is placed between a mounting area with the input pads and output pads and the gate drive IC 104, so that the gate drive IC 104 is bonded to the mounting area and electrically connected thereto.

Although this specification has been described with respect to a case in which the gate drive ICs 104 are bonded and mounted by the COG (Chip-On-Glass) method, the substrate 102 is not limited to a glass substrate. In the exemplary embodiments of the present invention, the substrate 102 of the display device 100 may be configured as various types of plastic substrates, as well as a glass substrate, including PI (polyimide), PC (polycarbonate), PNB (polynorborneen), PET (poly-ethyleneterephthalate), PEN (polyethylenapthanate), PES (polyether-sulfone), etc. Also, the drivers (e.g., the gate drive ICs and the data drive ICs) of the display device 100 may be directly bonded to and mounted in the non-active area of such a plastic substrate.

It should be noted that the configuration of the display device 100 explained with reference to FIG. 1 is intended only to help understanding of the present invention, and various signals and power used for the configuration, layout, and operation of the display device 100 according to the present invention are not limited to this. For example, the data drivers, as well as the gate drivers, may be directly bonded to one side or both sides of the non-active area of the substrate 102, and mounted by the COG method. In this case, the output pads positioned at each of the data drivers for mounting the data drive ICs may be connected to the data lines DL to supply a data signal to the subpixels SP of the active area AA.

The display device 100 may include drivers formed directly in the non-active area NA, in addition to the drivers mounted in the non-active area NA by being bonded thereto. For example, if the data drivers of the display device 100 are directly bonded to and mounted in the non-active area NA by the COG method, the gate drivers may be provided in the non-active area NA of the substrate 102 by such a method as GIP (Gate-In-Panel).

Figure 2:
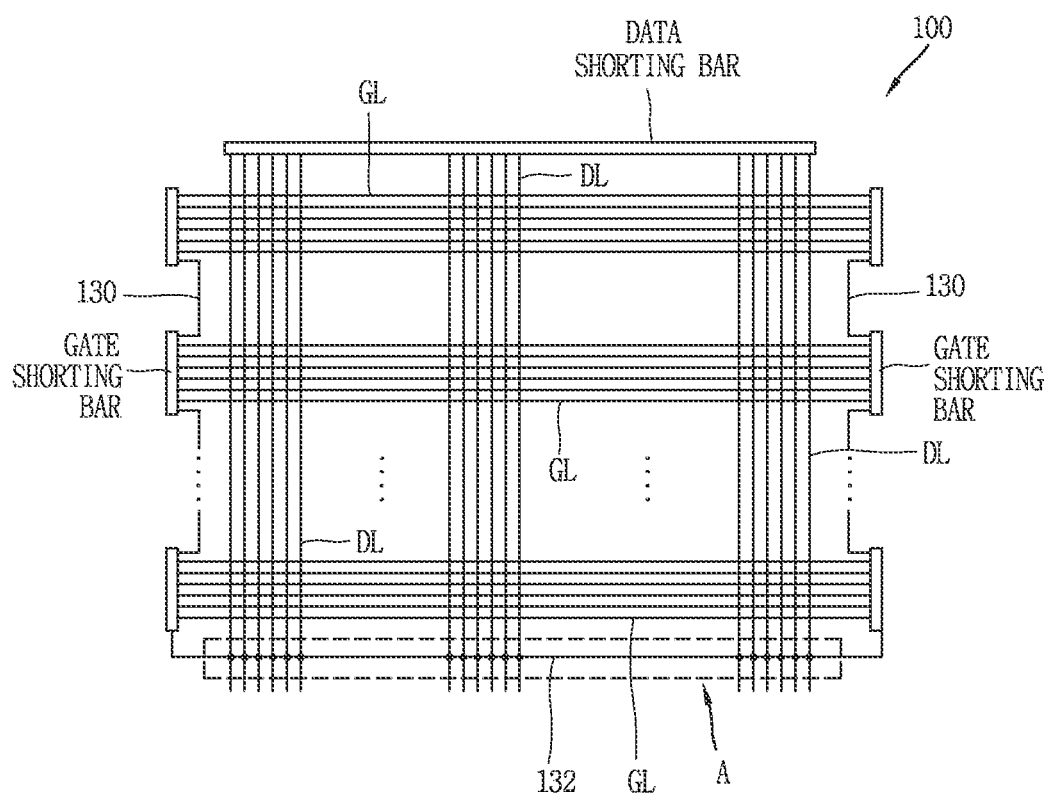
FIG. 2 is a schematic view of a structure of a display device according to one exemplary embodiment of the present invention, the display device including a first equipotential line connecting gate shorting bars for connecting gate lines within driving blocks and a second equipotential line connecting data lines to a gate dummy line.

FIG. 2 is a schematic view of a structure of a display device according to one exemplary embodiment of the present invention, the display device including a first equipotential line connecting gate shorting bars for connecting gate lines within driving blocks and a second equipotential line connecting data lines to a gate dummy line.

FIG. 3 is a schematic view of a structure of a display device according to one exemplary embodiment of the present invention, the display device including a first equipotential line connecting gate shorting bars for connecting a plurality of gate lines within driving blocks and a gate dummy line connecting two opposite ends of the gate lines within the last driving block.

As shown in FIGS. 2 and 3, the display device 100 according to the present invention includes a plurality of driving blocks COG Block_1, COG Block_2, . . . , COG Block_n consisting of a plurality of gate lines GL, a gate shorting structure, e.g., gate shorting bars, that connects two opposite ends of the gate lines GL within the driving blocks COG Block_1, COG Block_2, . . . , COG Block_n, a first equipotential line 130 that interconnects gate shorting bars within neighboring driving blocks COG Block_1, COG Block_2, . . . , COG Block_n to create an equipotential between the driving blocks, a gate dummy line 132 that connects gate shorting bars for connecting two opposite ends of the gate lines GL within the last driving blocks COG Block_n, a data shorting bar that connects the plurality of data lines intersecting the plurality of gate lines, and a second equipotential line that is connected to the gate dummy line and extend from an active layer disposed under the data lines. As shown in FIGS. 2 and 3, the active area AA of the display device 100 according to the present invention includes at least two driving blocks COG Block. A driving block COG Block is defined by gate lines and data lines (e.g., GL and DL) for outputting a signal to the subpixels of the active area AA from an individual drive integrated chip (e.g., a gate drive IC or a data drive IC) or a combination of drive integrated chips constituting a group (e.g., a pair of gate drive ICs or a pair of data drive ICs). That is, the active area AA includes lines for sending a signal applied from a different drive integrated chip D-IC or a combination of different drive integrated chips and subpixels connected to the lines, and at least two driving blocks COG Block consisting of subpixels that are connected to the lines to be driven.

For example, a driving block COG Block may be a conductive path through which a gate signal output from the gate drive IC 104 mounted on a gate driver is passed to the subpixels of the active area AA.

This will be described in more detail with reference to FIGS. 2 and 3. Each of the gate drive ICs is mounted on each of the gate drivers arranged on one side of the non-active area NA to apply a gate signal to the output pads included in the corresponding gate driver, and the output pads are applied to the gate lines GL of the active area AA to constitute a driving block COG Block.

Meanwhile, for data drive ICs mounted in the COG form on the data drivers of the substrate 102, a driving block COG Block may be defined by output pads of data drivers where data drive ICs are mounted and data lines DL in the same way as stated above.

Moreover, as shown in the display device 100 of FIG. 3, in which the gate drivers are positioned on two opposite sides of the non-active area, gate lines GL extending from two gate drivers facing each other may be electrically connected to form a driving block COG Block.

As explained above, electrical charges generated or entering during various steps of the fabrication process of the display device 100 may be trapped on various organic or inorganic films of the display device 100. The electrical charges generated or entering during the process make differences in loading effect between the driving blocks COG Block.

The present inventors found out that, during plasma treatment, dry etching, or other process steps for improving the transistor characteristics, the differences in loading effect between the driving blocks COG Block lead to non-uniformity in plasma state density, resulting in various display problems due to a negative shift in the threshold voltage of the transistors positioned between the driving blocks COG Block_1, COG Block_2, . . . , COG Block_n.

However, the display device 100 of the present invention is configured to create an equipotential between the driving blocks COG Block of the active area AA during the fabrication process; that is, it has the first equipotential line 130 shown in FIG. 3. This reduces the differences in loading effect between the driving blocks COG Block_1, COG Block_2, . . . , COG Block_n during the fabrication process of the display device 100, thereby minimizing the difference in electrical properties between the transistors constituting the pixel circuits of a final display device 100.

This will be described in more detail. As shown in FIG. 3, a plurality of gate lines GL constituting each driving block COG Block are connected to the first equipotential line 130 to create an equipotential between the gate lines GL.

In addition, the present inventors found out that an electrical charge difference is generated between the gate lines and the data lines because the gate lines and the data lines are formed separately on the substrate and this increases the possibility of leaving floating impurities or organic impurities on top of the gate lines or on overlapping portions between the gate lines and source/drain electrodes.

However, the present invention eliminates any electrical charge difference between the data lines by forming a second equipotential line by connecting a conductive active layer portion, which lies under a plurality of data lines intersecting a gate dummy line formed in the last driving block, to the gate dummy line. This decreases the possibility of leaving floating or organic impurities on top of the gate lines made of the same metal layer or on overlapping portions between the gate lines and the data lines, which are made of different metal layers, during the process steps, thereby greatly reducing impurity defects.

Particularly, as shown in FIG. 3, a gate dummy line 132 is formed at the gate shorting bars on two opposite sides of the last driving block COG Block_n, and a conductive active layer portion (see 138b of FIG. 9H), i.e., a second equipotential line 138b, which lies under a plurality of data lines DL intersecting the gate dummy line 132, is connected to the gate dummy line, whereby an equipotential is formed. However, the present invention is not necessarily limited thereto, and the gate dummy line 132 may extend from at least one of the plurality of driving blocks according to the design of the display device.

As shown in FIG. 3, the active area AA has n driving blocks COG Block. Each driving block COG Block_1, COG Block_2, . . . , COG Block_n includes gate lines that extend across the active area AA from the gate drivers arranged on two opposite sides of the non-active area (see NA of FIG. 1) of the display device 100. Each gate line GL is configured to apply a gate signal for controlling the on/off of transistors for driving the subpixels of the active area AA. That is, the subpixels included in each driving block COG Block_1, COG Block_2, . . . , COG Block_n are driven by a gate signal output from a gate drive IC 104.

In FIG. 3, each driving block COG Block includes gate lines GL that receive a gate signal from a pair of gate drive ICs 104 mounted on corresponding gate drivers positioned on two opposite sides of the non-active area. Alternatively, according to another embodiment of the present invention, each driving block COG Block may be configured to receive a gate signal from one of the gate drivers arranged in the non-active area positioned on one side of the substrate 102.

The subpixels connected to the gate lines GL of each driving block COG Block are configured to receive a gate signal from a different gate drive IC 104 or different group of gate drive ICs 104 from that for the subpixels of other driving blocks COG Block. However, the display device 100 includes a first equipotential line 130 for electrically connecting the gate shorting bars within the driving blocks COG Block_1, COG Block_2, . . . , COG Block_n so that the driving blocks COG Block are temporarily equipotential. That is, in the case that there are several driving blocks COG Block, each of which is driven by an individual gate drive IC 104 or an individual group of gate drive ICs 104, an equipotential is created between the driving blocks COG Block through the first equipotential line 130 for electrically connecting a gate shorting structure, for example, the gate shorting bars, within the driving blocks COG Block. This reduces the difference in loading effect between the driving blocks COG Block caused by electrical charges generated during the process, thereby minimizing variations of the device characteristics of the transistors between regions of the display device 100.

Figure 4A:
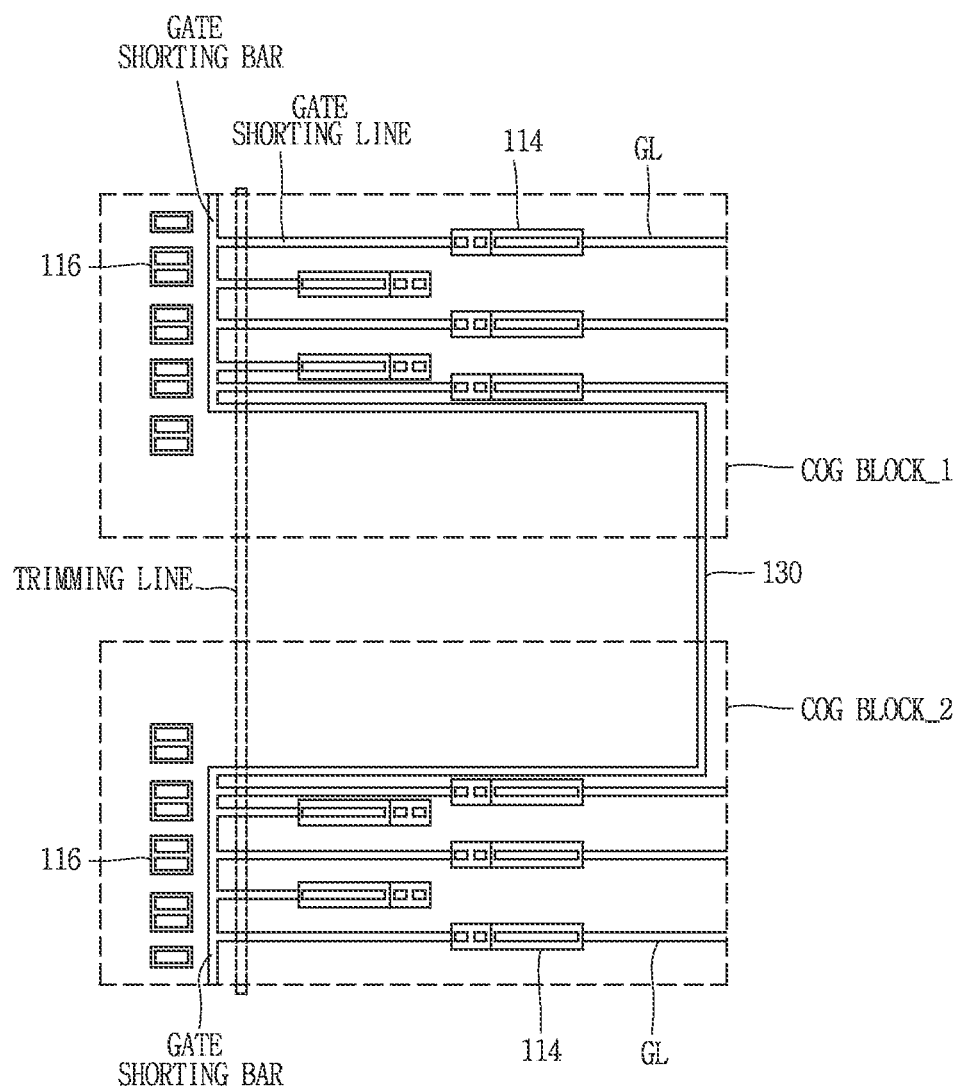
FIG. 4A is a schematic view of a first equipotential line that connects gate shorting bars for connecting gate lines within neighboring driving blocks according to one exemplary embodiment of the present invention.

Before performing a test, such as an ART test (array test) or an AP test, which requires application of a different signal to each driving block COG Block or to the gate lines GL of each driving block COG Block during the fabrication process of the display device 100, inspection or other process steps may be performed after removing the first equipotential line 130 formed between the driving blocks COG Block FIG. 4A is a schematic view of a first equipotential line that connects gate shorting bars for connecting gate lines within neighboring driving blocks according to one exemplary embodiment of the present invention.

As shown in FIG. 4A, the output pads are connected to gate shorting bars in order to temporarily short the gate lines GL extending from the output pads within each gate driver. In this specification, connecting portions for connecting the gate shorting bars and the pads within each gate driver and connecting portions for connecting the gate shorting bars and the first equipotential line 130 may be referred to as gate shorting lines. The gate shorting lines between the first equipotential line 130, which creates an equipotential between the driving blocks COG Block, and the gate shorting bars may be cut in the course of cutting part of the gate shorting lines between the output pads and the gate shorting bars, within each gate driver.

Also, because the gate shorting lines correspond to the portions connecting the gate lines to the gate shorting bars, the gate shorting lines may be referred to as part of the gate lines.

For example, as shown in FIG. 4A, the output pads 114 positioned in the first driving block COG Block_1 and second driving block COG Block_2 are connected to the gate lines GL that apply a signal for turning on/off the transistors connected to the subpixels in the active area. As a result, a gate signal output from the gate drive IC (see 104 of FIG. 1) mounted on each gate drivers is applied to the transistors connected to the subpixels of the active area AA through the output pads 114 and the gate lines GL. As explained above, a gate signal output from a specific gate drive IC 104 or a combination of specific gate drive ICs 104 is applied to drive the subpixels positioned in the driving blocks COG Block_1, COG Block_2, . . . , COG Block_n.

During various fabrication and inspection steps of the fabrication process of the display device 100 including such COG-type drivers, static electricity ESD may enter the display device 100. For example, static electricity ESD may enter through various paths, including transferring the substrate 102 or forming transistors on the substrate 102.

That is, each gate driver may include a gate shorting bar for temporarily shorting the output pads 114, which is placed between an input pad area where multiple input pads 116 are positioned and an output pad area where multiple output pads 114 are positioned. The gate shorting bar may be positioned between the output pads 114 and the input pads 116, within each gate driver.

As shown in FIG. 4A, in the display device 100 including COG-type drivers, an equipotential is temporarily created between the output pads 114 of each driving block COG Block and the gate lines GL by using gate shorting bars. However, the display device 100 of the present invention includes a first equipotential line 130 for temporarily creating an equipotential between the driving blocks COG Block since there may be a potential difference between the driving blocks COG Block.

As shown in FIG. 4A, the first equipotential line 130 is positioned between neighboring driving blocks COG Block_1 and COG Block_2 and brought into contact with the gate shorting bars positioned in the driving blocks COG Block_1 and COG Block_2. That is, the first equipotential line 130 is configured to extend between neighboring driving blocks COG Block_1 and COG Block_2 to interconnect the gate shorting bars within the first driving block COG Block_1 and the gate shorting bars within the second driving block COG Block_2.

As the gate shorting bars within the first driving block COG Block_1 and the gate shorting bars within the second driving block COG Block_2 are connected together in the fabrication process of the display device, an equipotential is created between the first driving block COG Block_1 defined by the conductive path for the first gate driver and the second driving block COG Block_2 defined by the conductive path for the second gate driver.

This will be described in more detail with reference to FIG. 4A. Both the gate lines GL connected to the gate shorting bars within the first driving block COG Block_1 and the gate lines GL connected to the gate shorting bars within the second driving block COG Block_2 are equipotential by means of the first equipotential line 130.

The above-explained first equipotential line 130 may be composed of a dummy line Dummy_Line that becomes floating after completion of the fabrication process of the display device 100. As shown in FIG. 4A, the first equipotential line 130 may extend to the gate drivers in the active area AA of the display device 100. In this case, the first equipotential line 130 has portions that are arranged side by side with the gate shorting lines connecting the output pads 114 and the gate shorting bar. The first equipotential line 130 is routed from the first driving block COG Block_1 towards the second driving block COG Block_2, thereby making it easier to cut and remove part of the ends of the first equipotential line 130 contacting the gate shorting bars within each driving block COG Block, as shown in FIG. 4B.

In the fabrication process of the display device, a process or test for electrically separating the gate lines GL of each driving block COG Block may be performed. For example, it is necessary to sequentially apply a signal to the gate lines GL in order to perform a test such as an array test or AP test. Even when such a test is not performed, a gate signal should be applied to the individual gate lines GL of the display device, in order for the display device 100 to finally output an image. Hence, the output pads 114 of a finished display device 100 need to be insulated from the gate shorting bar.

Figure 4B:
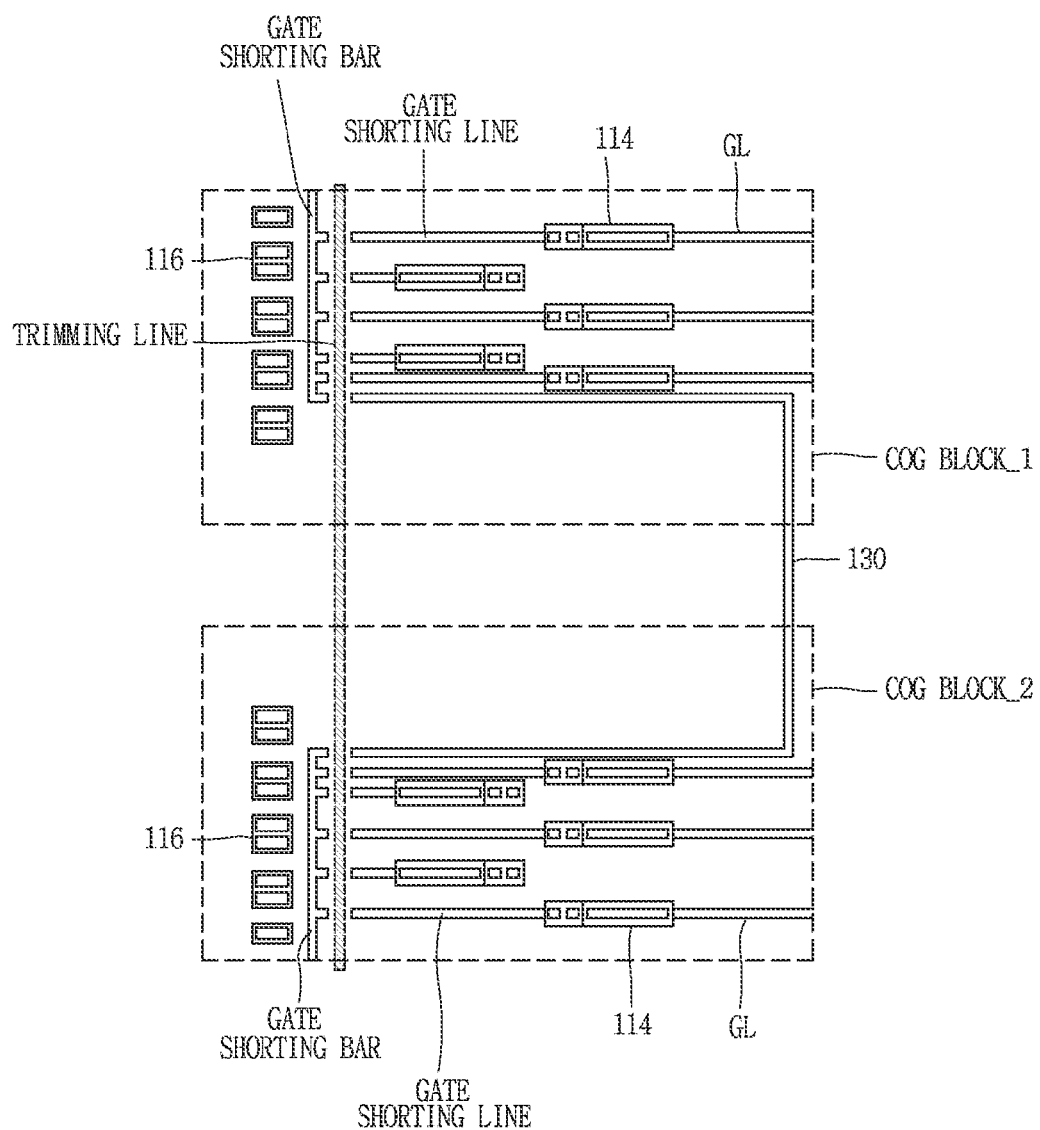
FIG. 4B is a schematic view of a first equipotential line that connects gate shorting bars for connecting gate lines within neighboring driving blocks, the first equipotential line being cut and separated from the gate shorting bars, according to one exemplary embodiment of the present invention.

FIG. 4B is a schematic view of a first equipotential line that connects gate shorting bars for connecting gate lines within neighboring driving blocks, the first equipotential line being cut and separated from the gate shorting bars, according to one exemplary embodiment of the present invention.

As shown in FIG. 4B, the display device thus fabricated has a first equipotential line 130 that is arranged between the first driving block COG Block 1 and the second driving block COG Block 2 and spaced apart from the shorting bars as a trimming region (or by an amount equal to a trimming region) along a trimming line within each driving block. Also, the display device has the first driving block COG Block_1 configured to receive a gate signal from the gate drive IC bonded to and mounted on the first gate driver and the second driving block COG Block_2 configured to receive a gate signal from the gate drive IC bonded to and mounted on the second gate driver.

That is, in the display device fabricated in the above-described method according to one exemplary embodiment of the present invention, a plurality of driving blocks COG Block_1, COG Block_2, . . . , COG Block_n each include a plurality of gate lines GL and a gate shorting structure, for example, gate shorting bars, which are spaced apart from the plurality of gate lines GL as the trimming region (or by an amount equal to the trimming region), i.e., the region corresponding to the trimming line. Also, the display device includes a first equipotential line 130 that extends from one (e.g., COG Block_1) of the plurality of driving blocks COG Block_1, COG Block_2, . . . , COG Block_n to a neighboring driving block (e.g., COG Block_2) and that is partially removed as the trimming region (or by an amount equal to the trimming region).

In some embodiments of the present invention, lines that temporarily create an equipotential between the driving blocks COG Block during the fabrication of the display device may be configured by using lines that provide an external input signal or voltage. In an example, the first equipotential line 130 may be composed of one of the lines routed to an external signal line area located on the outside of the display device 100. Since the use of a line with lower resistance is more advantageous to create an equipotential between the driving blocks COG Block, the line to be used as the first equipotential line 130 may be larger in area or thickness or higher in voltage than other lines.

In the structure of driving blocks shown in FIG. 4B, part of the gate shorting lines extending from the output pads 114 and contacting the gate shorting bars is removed along the trimming line, unlike the structure of FIG. 4A where driving blocks are equipotential. That is, the gate shorting lines between the output pads 114 and the gate shorting bars are divided up into two parts that are spaced apart from each other by an amount equal to the trimming region along the trimming line, and therefore the gate lines GL extending from the output pads 114 do not remain equipotential anymore. As a result, a signal can be applied to the gate lines GL individually.

The removal of part of conductive lines corresponding to the trimming line may be performed by a trimming process using laser radiation or various types of physical scribing processes.

Particularly, in one exemplary embodiment of the present invention, the gate shorting lines, which create an equipotential between the driving blocks COG Block, and the gate shorting bars may be partially removed, as well as cutting the gate shorting lines connecting the output pads and the gate shorting bars.

Once the output pads are insulated from the gate shorting bars by cutting the shorting lines extending from the output pads to the gate shorting bars within the driving blocks, the equipotential between the gate lines GL extending from the driving blocks COG Blocks may be eliminated, and the driving blocks COG Block defined by the gate lines GL extending from the driving blocks COG Block also may be non-equipotential. Even if the gate shorting bars and the output pads 114, within each driving block, are disconnected, the driving blocks may have an unintended electric effect as long as the first equipotential line 130 remains connected to the gate shorting bars of the driving blocks.

For this reason, part of the first equipotential line 130 creating an equipotential between the driving blocks COG or part of the gate shorting lines connecting the first equipotential line 130 and the gate shorting bars may be removed for more stable driving of the display device 110. Herein, the removal of part of the first equipotential line 130 or part of the gate shorting lines connecting the first equipotential line 130 and the gate shorting bars may be performed simultaneously with the step of removing part of the gate shorting lines connecting the output pads and the gate shorting bars within each driving block. That is, the first equipotential line 130 or the gate shorting lines between the first equipotential line 130 and the gate shorting bars may be cut in the same way as the gate shorting lines between the output pads 114 and the gate shorting bars within the driving blocks are cut along the trimming line.

As described above, the gate shorting lines connecting the first equipotential line 130 and the gate shorting bars within each driving block may be disposed to run across the trimming region or the trimming line from which the gate shorting lines are removed, to make it easy to cut the first equipotential line 130 or the gate shorting lines extending from the first equipotential line 130 to the gate shorting bars, along with the gate shorting lines connecting the output pads 114 and the gate shorting bars. For example, two opposite ends of the first equipotential line 130 connecting the gate shorting bars of the first and second driving blocks are formed to run across the trimming line and extend to the gate shorting bars within the first and second driving blocks.

In this case, in the process of cutting the gate shorting lines connecting the gate shorting bars and output pads 114 of the driving blocks along the trimming line, two opposite ends of the first equipotential line 130 contacting the two gate shorting bars also may be cut and separated from the gate shorting bars, without an additional process.

Figure 5:
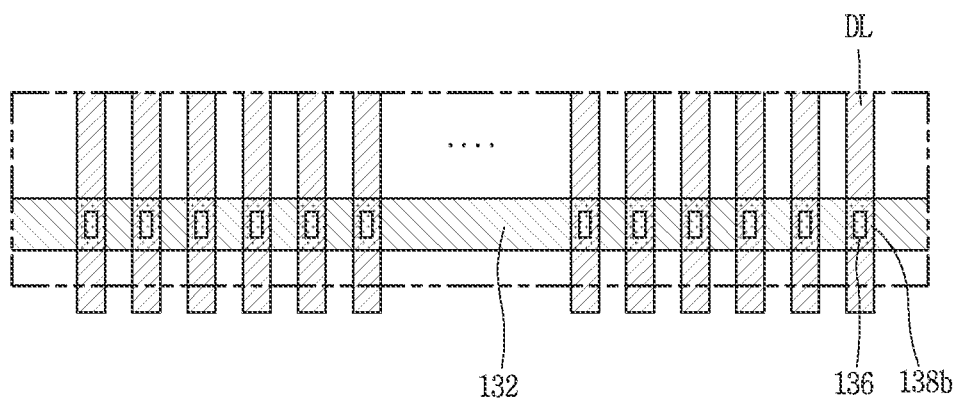
FIG. 5 is an enlarged view of the part "A" of FIG. 2, which enlargedly depicts that the data lines and the gate dummy line are equipotential in the display device according to one exemplary embodiment of the present invention.

FIG. 5 is an enlarged view of the part "A" of FIG. 2, which enlargedly depicts that the data lines and the gate dummy line are equipotential in the display device according to one exemplary embodiment of the present invention.

As shown in FIG. 5, the gate dummy line 132 connecting two opposite ends of the gate lines GL within the last driving block COG Block_n is formed. A conductive active layer portion (see 138b of FIG. 7), i.e., a second equipotential line 138b, which lies under a plurality of data lines DL intersecting the gate dummy line 132, is connected to the gate dummy line 132, thereby creating an equipotential between the plurality of data lines DL.

Figure 6:
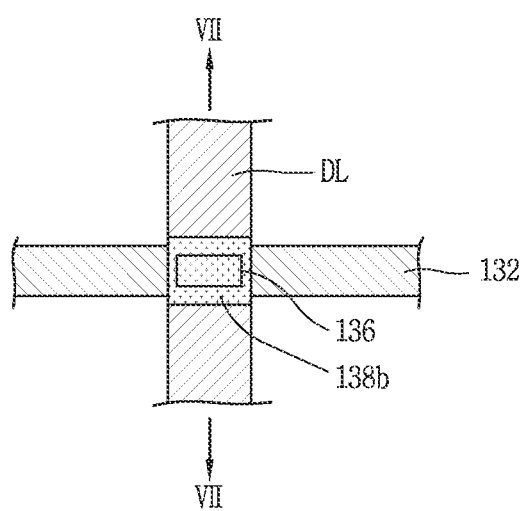
FIG. 6 is an enlarged plane view of a connection structure between one of the data lines and the gate dummy line shown in FIG. 5.

FIG. 6 is an enlarged plane view of a connection structure between one of the data lines and the gate dummy line shown in FIG. 5.

Figure 7:
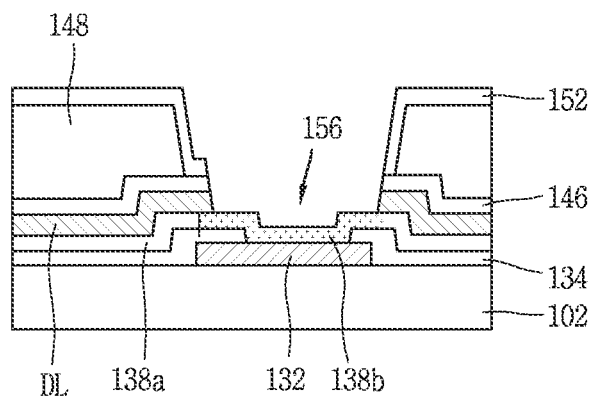
FIG. 7 is a cross-sectional view taken along the line VII-VII of FIG. 6, which schematically shows a connection structure between the second equipotential line composed of a conductive active layer portion of the data lines and the gate dummy line, in the display device according to one exemplary embodiment of the present invention.

FIG. 7 is a cross-sectional view taken along the line VII-VII of FIG. 6, which schematically shows a connection structure between the second equipotential line composed of a conductive active layer portion of the data lines and the gate dummy line, in the display device according to one exemplary embodiment of the present invention.

As shown in FIGS. 6 and 7, the gate dummy line 132 connected to the gate shorting bars within the last driving block COG Block is formed on the substrate 102, along with the gate lines GL constituting each of the driving blocks COG Block_1, COG Block_2, . . . , COG Block_n).

Each driving block COG Block includes gate lines GL that receive a gate signal from a pair of corresponding gate drive ICs positioned on two opposite sides of the non-active area.

The gate dummy line 132 constitutes the last driving block COG Block_n, and extends from the gate shorting bars connecting two opposite ends of the gate lines GL in the corresponding gate drivers positioned on two opposite sides of the non-active area.

A gate insulating film 136 with a dummy line contact hole 136 exposing the gate dummy line is formed on the entire surface of the substrate 102 including the gate dummy line 132.

An active layer 134 is formed in pixel areas including thin film transistor areas of the gate insulating film 136, a second equipotential line 138b composed of a conductive active layer portion is formed in the dummy line contact hole 136 on the gate dummy line 132, and a plurality of data lines DL intersecting the gate dummy line 132 are formed on the active layer 138a. In this case, part of the second equipotential line 138b corresponding to the conductive active layer portion is in contact with the data lines DL.

Referring to FIG. 7, the second equipotential line 138b includes some part of the active layer that overlaps the gate dummy line 132 but does not overlap the data lines DL, and the data lines DL are electrically connected to the gate dummy line 132 through the second equipotential line 138b. Although described later, the gate dummy line 132 and the data line DL are insulated from each other by finally removing some part of the active layer 138a that overlaps the gate dummy line 132 but does not overlap the data lines DL.

Figure 8:
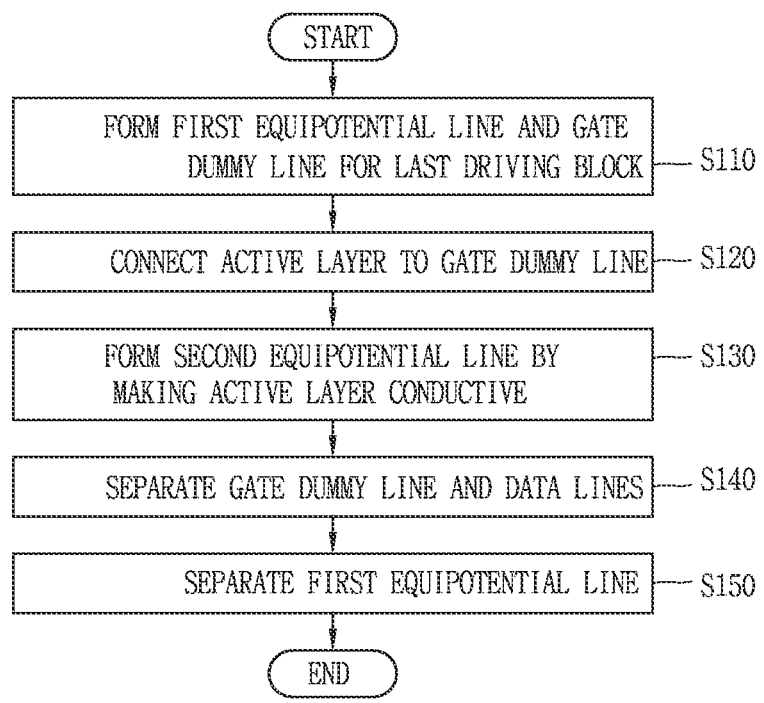
FIG. 8 is a flowchart of the formation and separation of equipotential lines of a display device according to one exemplary embodiment of the present invention.

FIG. 8 is a flowchart of the formation and separation of equipotential lines of a display device according to one exemplary embodiment of the present invention.

As shown in FIG. 8, in the first step S110, a plurality of gate lines (see GL of FIG. 2) are formed on the substrate, and at the same time, a first equipotential line 130 and a gate dummy line (see 132 of FIG. 3) are formed, the first equipotential line 130 connecting the driving blocks (see COG Block_1, COG Block_2, and COG Block_n of FIG. 3), and the gate dummy line constituting the last driving block (see COG Block_n of FIG. 3) and extending from the gate shorting bars connecting two opposite ends of the gate lines GL within the corresponding gate drivers positioned on both sides of the non-active area of the substrate.

Next, in the second step S120, a gate insulating film with a dummy contact hole exposing the gate dummy line is formed, and an active layer connected to the gate dummy line is connected to the gate insulating film.

Next, in the third step S130, a source electrode, a drain electrode, and data lines are formed by half-tone exposure and development, and at the same time, the active layer portion on the gate dummy line is made conductive to form a second equipotential line connected to the gate dummy line.

Next, in the fourth step S140, a pixel electrode connected to the source or drain electrode is formed, and at the same time, part of the second equipotential line connected to the gate dummy line, i.e., some part of the active layer 138a that overlaps the gate dummy line 132 but does not overlap the data lines DL, is removed to separate the data lines from the gate dummy line.

Next, in the fifth step S150, before performing a test, such as an ART test (array test) or an AP test, which requires application of a different signal to each driving block COG Block or to the gate lines GL of each driving block COG Block during the fabrication process of the display device 100, the first equipotential line 130 electrically connecting the driving blocks COG Block_1, COG Block_2, and COG Block_n is separated.

Meanwhile, a method of fabricating and separating a second equipotential line of a display device according to the present invention will be described with reference to FIGS. 9A to 9M.

FIGS. 9A to 9M are process cross-sectional views schematically showing the formation and separation of a second equipotential line between data lines and a gate dummy line, in a display device according to one exemplary embodiment of the present invention.

As shown in FIG. 9A, first of all, a plurality of gate lines (see GL of FIG. 3) constituting each driving block COG Block and a gate electrode 131 extending from the gate lines and at the same time a first equipotential line (see 130 of FIG. 3) connecting the driving blocks COG Block_1, COG Block_2, and COG Block_n are formed by depositing a gate metal layer on the substrate 102 and selectively removing the gate metal layer by a photoetching technique. In this case, a gate dummy line 132, which constitutes the last driving block COG Block_n and connects the gate shorting bars connecting two opposite ends of the gate lines GL in the corresponding gate drivers positioned on two opposite sides of the non-active area, is formed simultaneously with the formation of the gate lines GL.

Next, as shown in FIG. 9B, a gate insulating film 134 is formed on the entire surface of the substrate including the gate lines GL and the gate dummy line 132 is formed by using a silicon oxide film or silicon nitride film, and then the gate insulating film 134 is selectively removed by a photoetching technique, thereby forming a dummy line contact hole 136 exposing the gate dummy line 132.

Next, as shown in FIG. 9C, an active layer 138 and made of oxide semiconductor and a metal layer 140 are sequentially stacked on top of the gate insulating film 134, and then a photosensitive film 142 is applied on top of the metal layer 140.

Then, a slit mask 144 with refractive properties is placed on top of the photosensitive film 142 for half-tone exposure. In this case, the slit mask 144 includes a light blocking portion 144a, a semi-transmissive portion 144b, and a transmissive portion 144c.

Figure 9D:
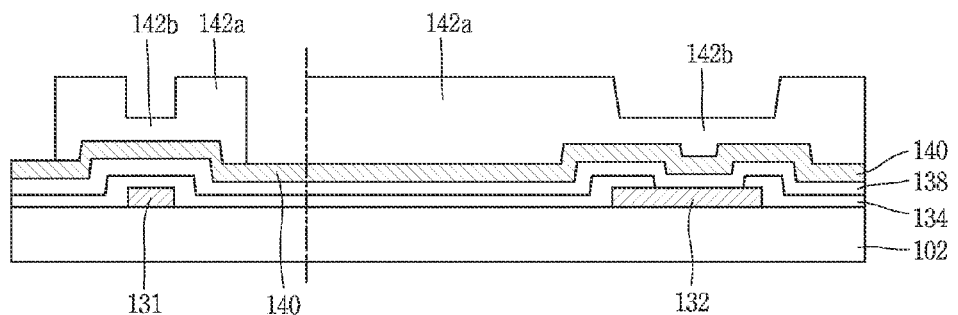

Next, as shown in FIG. 9D, photosensitive film patterns 142a and 142b are formed by selectively removing the photosensitive film 142 by development after undergoing the half-tone exposure using the slit mask 144. The second photosensitive film pattern 142b is thinner than the first photosensitive film pattern 142a. That is, the first photosensitive film pattern 142a overlaps a data line forming region of the metal layer 140 and a source/drain electrode forming region, and the second photosensitive film pattern 142b overlaps a channel area of the active layer 18 and the top of the gate dummy line 132.

Figure 9E:
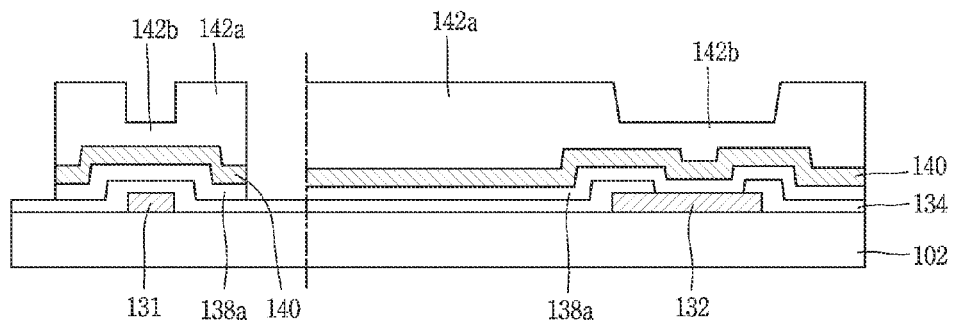

Next, as shown in FIG. 9E, an active layer pattern 138a is formed by etching the metal layer 140 and the active layer 138 by using the first and second photosensitive film patterns 142a and 142b as an etching mask.

Figure 9F:
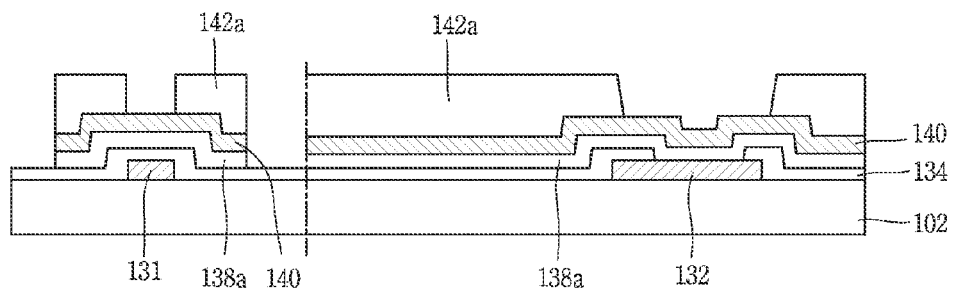

Next, as shown in FIG. 9F, the metal layer 140 over the channel area of the active layer pattern 138a and the metal layer portion 140 on the gate dummy line 132 are exposed by etching the second photosensitive film pattern 142b through an ashing process. In this case, part of the thickness of the first photosensitive film pattern 142a is also etched through the ashing process.

Figure 9G:
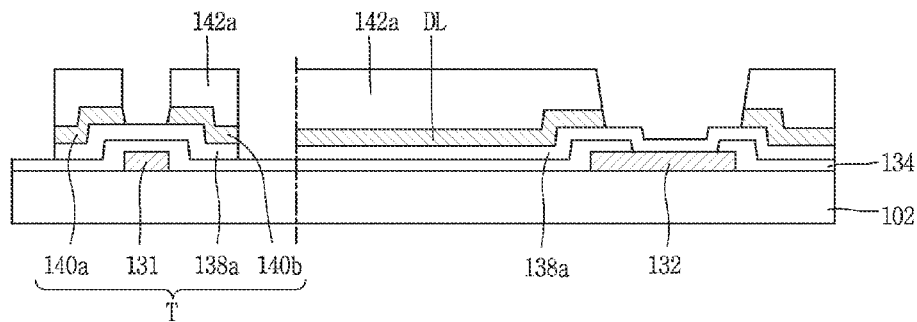

Next, as shown in FIG. 9G, the metal layer 140 is etched by using the first photosensitive film pattern 142a as an etching mask, whereby data lines DL intersecting the gate lines GL extending from the source electrode 140a, along with the source electrode 140a and drain electrode 140b spaced apart from each other, are formed. At the same time, the channel area of the active layer pattern 138a and the active layer pattern portion 138a on the gate dummy line 132 are externally exposed. In this case, the gate electrodes 131, the active layer pattern 138a, the source electrode 140a, and the drain electrode 140b constitute a thin film transistor T.

Figure 9H:
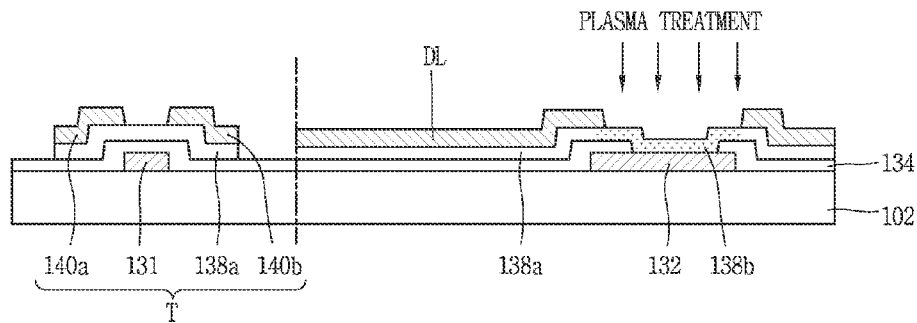

Next, as shown in FIG. 9H, a second equipotential line 138b is formed by performing plasma treatment on the active layer pattern portion 138a on the gate dummy line 132 to make the active layer pattern 138a conductive. The second equipotential line 138b is connected to the underlying gate dummy line 132, and also connected to the data lines DL. That is, part of the active layer pattern 138a under the data lies DL becomes conductive during plasma treatment of the externally-exposed active layer pattern portion 138a. As a result, the data lines DL and the second equipotential line 138b are connected together.

Accordingly, the data lines DL are connected to the gate dummy line 132 by the second equipotential line 138b, thereby creating an equipotential between the gate lines GL and the data lines DL.

Figure 9I:
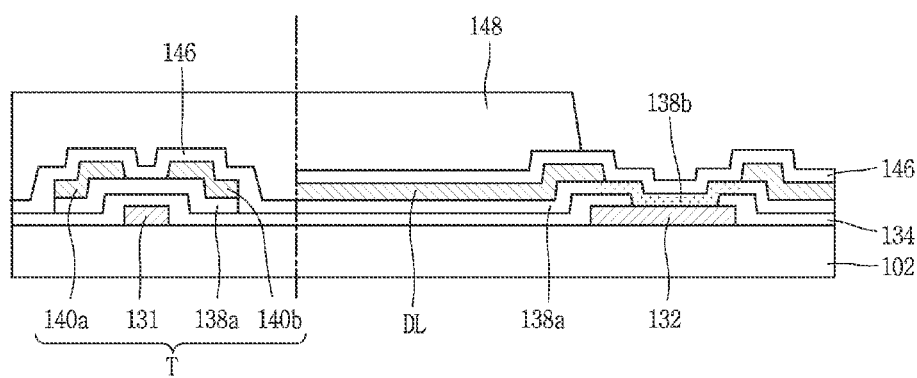

Subsequently, the remaining first photosensitive film pattern 142a is removed, and then, as shown in FIG. 9I, a first passivation film 146 made of an inorganic insulating material and an organic insulating film 148 are stacked on the entire surface of the substrate including the data lines DL and the second equipotential line 138b.

Figure 9J:
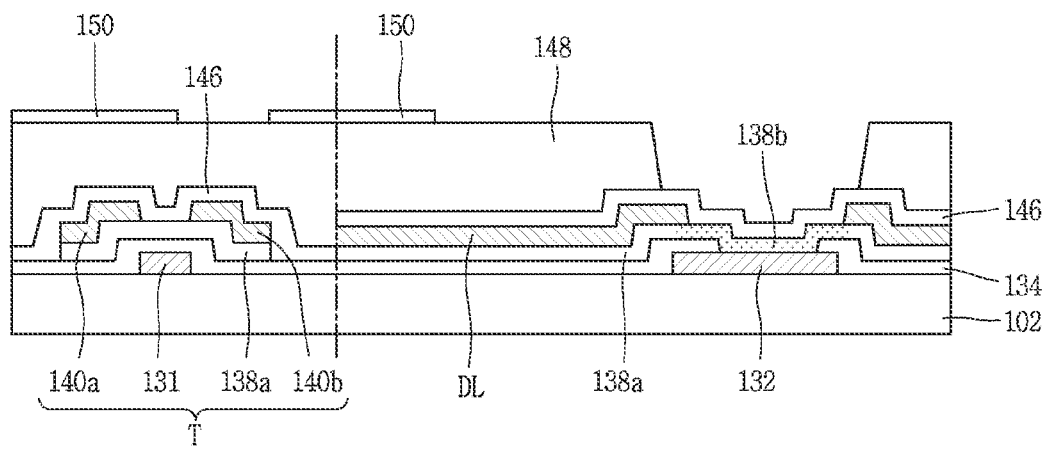

Next, as shown in FIG. 9J, a common electrode 150 is formed by depositing a transparent conductive layer on top of the organic insulating film 148 and then selectively etching the transparent conductive layer.

Figure 9K:
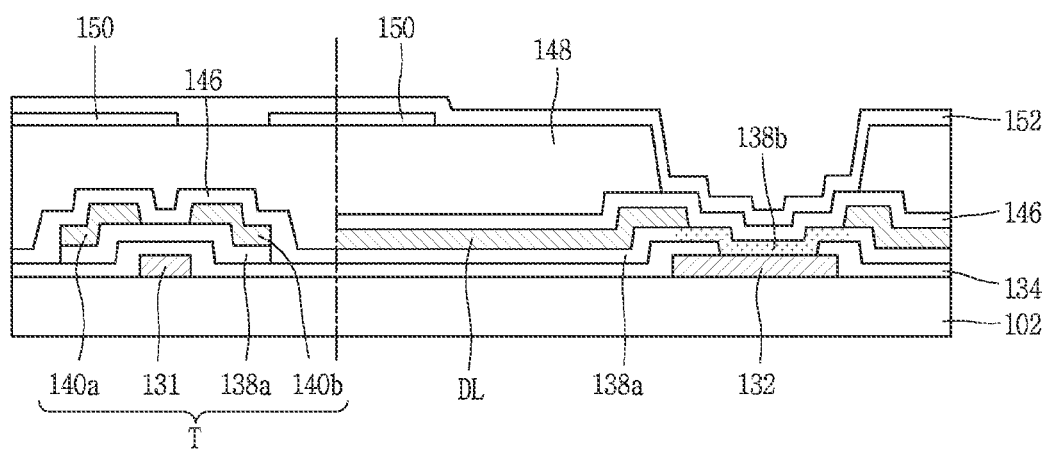

Next, as shown in FIG. 9K, a second passivation film 152 made of an inorganic insulating material is deposited on the entire surface of the substrate including the common electrode 150.

Figure 9L:
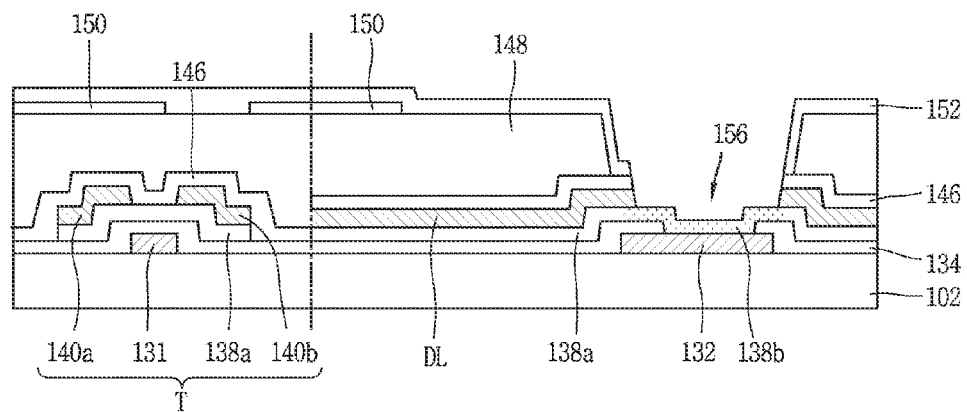

Next, as shown in FIG. 9L, an equipotential line contact hole 156 exposing the second equipotential line 138b, along with a drain contact hole 154 exposing the drain electrode 140b, is formed by etching the second passivation film 152 and the underlying organic insulating film 148 and first passivation film 146 by a photoetching technique.

Subsequently, a transparent conductive material layer made of a transparent conductive material such as ITO (indium tin oxide) or IZO (indium zinc oxide) is deposited on the second passivation film 152. In this case, the transparent conductive material layer is also formed on the exposed second equipotential line 138b.

Figure 9M:
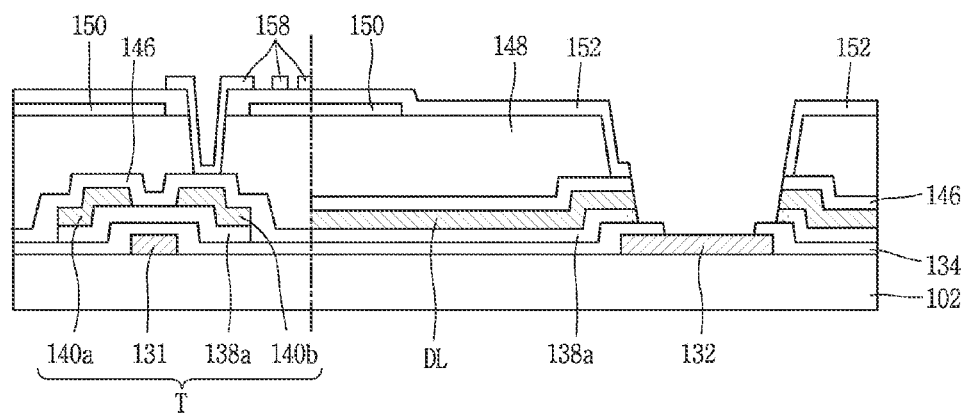

Next, as shown in FIG. 9M, a pixel electrode 158 contacting the drain electrode 140b is formed by selectively etching the transparent conductive material layer by an etching technique. Part of the second equipotential line 138b that overlaps the gate dummy line 132 but does not overlap the data lines DL is removed simultaneously with the formation of the pixel electrode 158, whereby the data lines DL are separated and insulated from the gate dummy line 132. Accordingly, due to the removal of part of the second equipotential line 138b, the equipotential between the gate lines GL and the data lines DL is eliminated.

Then, although not shown, the first equipotential line 130 connecting the driving blocks COG Block_1, COG Block_2, and COG Block_n is cut and separated by laser trimming before performing a test, such as an ART test (array test) or an AP test, which requires application of a different signal to each driving block COG Block or to the gate lines GL of each driving block COG Block during the fabrication process of the display device 100, whereby the equipotential between the gate lines GL within the driving blocks is eliminated.

During the laser trimming, the gate dummy line 132 is also separated from the last driving block COG Block_n by cutting two opposite ends of the gate dummy line 132 connected to the gate shorting bars connecting two opposite ends of the gate lines GL within the last driving block COG Block_n.

The above-described structure in which the first equipotential line between the driving blocks and the second equipotential line between the data lines are separated from the driving blocks and the gate dummy line will be described below with reference to FIG. 10.

Figure 10:
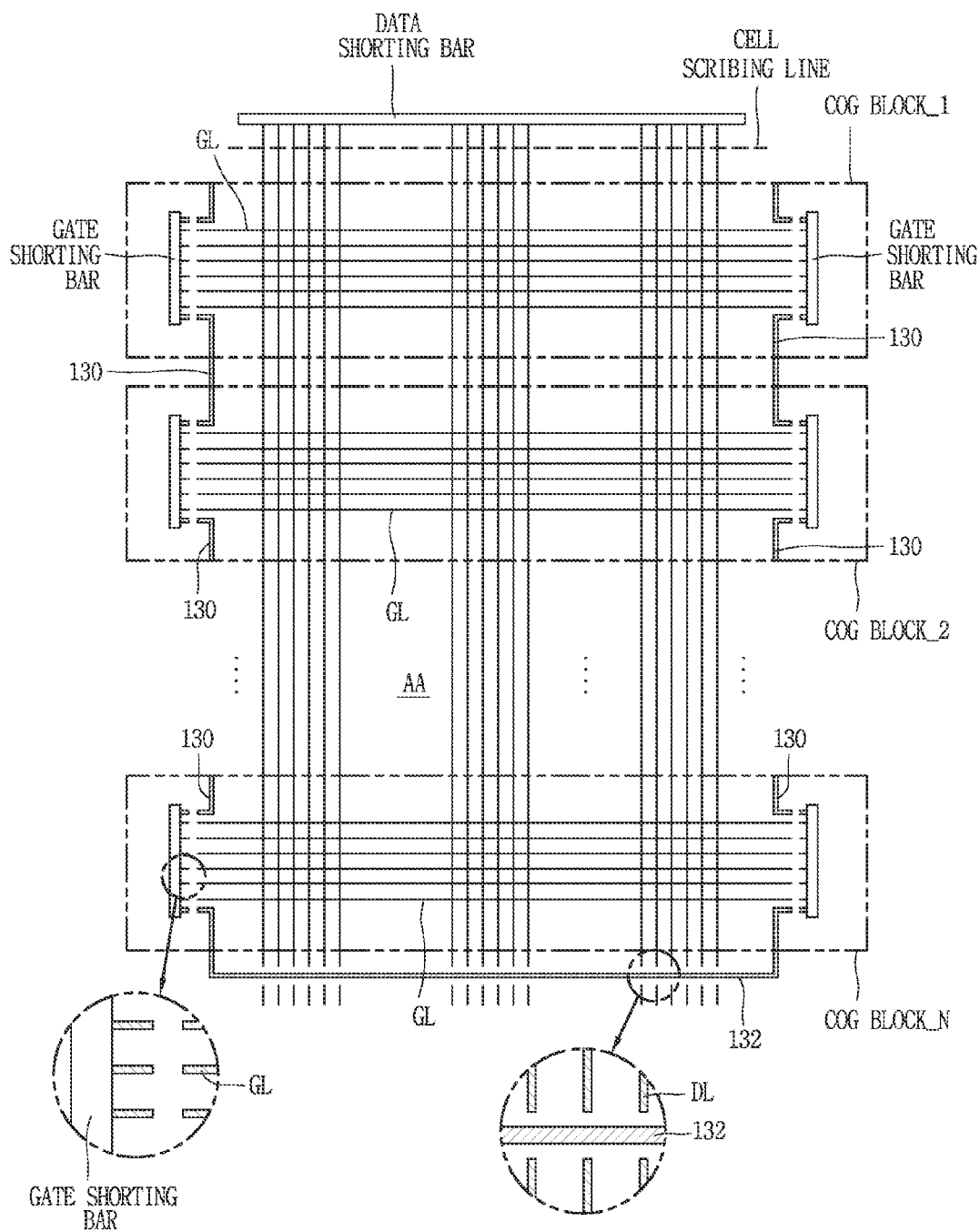
FIG. 10 is a schematic view of gate lines separated from gate shorting bars within each driving block and data lines separated from a gate dummy line, which are caused by the separation of first and second equipotential lines and performed to mount a gate drive IC and a data drive IC, in a display device according to one exemplary embodiment of the present invention.

FIG. 10 is a schematic view of gate lines separated from gate shorting bars within each driving block and data lines separated from a gate dummy line, which are caused by the separation of first and second equipotential lines and performed to mount a gate drive IC and a data drive IC, in a display device according to one exemplary embodiment of the present invention.

As shown in FIG. 10, the gate lines GL within each driving block are spaced apart from the gate shorting bars as a trimming region (or by an amount equal to a trimming region). More specifically, part of the gate shorting lines (see the gate shorting lines of FIG. 4B) connecting the gate lines GL and the gate shorting bars within each driving block is removed along a trimming line (see the trimming line of FIG. 4A). That is, as mentioned previously, seeing that the gate shorting lines are a part of the gate lines, the gate shorting bars and the gate lines GL are spaced apart from each other by an amount equal to the trimming region.

Accordingly, the equipotential between the gate lines GL is eliminated, and the gate lines GL individually receive a signal.

The removal of part of conductive lines corresponding to the trimming line may be performed by a trimming process using laser radiation or various types of physical scribing processes.

Particularly, in one exemplary embodiment of the present invention, as well as cutting the gate shorting lines connecting the gate shorting bars, part of the first equipotential line 130 creating an equipotential between the driving blocks COG Block and part of the gate shorting lines connecting the first equipotential line 130 and the gate shorting bars may be removed. As the first equipotential line 130 is also connected to the gate shorting bars through the gate shorting lines, the gate shorting lines connected to the first equipotential line 130 may be referred to as part of the first equipotential line 130. To sum up, part of the first equipotential line 130 corresponding to, for example, the trimming line may be removed.

Once the gate shorting bars are insulated from the gate lines GL and the first equipotential line 130 by removing part of the gate lines GL connected to the gate shorting bars and part of the first equipotential line 130 within the driving blocks, the equipotential between the gate lines GL extending from the driving blocks COG Blocks may be eliminated, and the equipotential between the driving blocks COG Block defined by the gate lines GL extending from the driving blocks COG Block also may be eliminated. Even if the gate shorting bars and the gate lines GL, within each driving block, are disconnected, the driving blocks may have an unintended electric effect as long as the first equipotential line 130 remains connected to the gate shorting bars of the driving blocks.

For this reason, part of the first equipotential line 130 creating an equipotential between the driving blocks COG or part of the gate shorting lines connecting the first equipotential line 130 and the gate shorting bars may be removed for more stable driving of the display device 110. Herein, the removal of part of the first equipotential line 130 or part of the gate shorting lines connecting the first equipotential line 130 and the gate shorting bars may be performed simultaneously with the step of removing part of the gate shorting lines connecting the output pads and the gate shorting bars within each driving block. That is, the first equipotential line 130 or the gate shorting lines between the first equipotential line 130 and the gate shorting bars may be cut in the same way as the gate shorting lines between the gate shorting bars within the driving blocks are cut along the trimming line.

Meanwhile, as shown in FIG. 10, the equipotential between the data lines DL and the gate lines GL is eliminated by removing part of the second equipotential line 138b composed of a conductive active layer portion extending from the active layer pattern 138a under the data lines DL. That is, the equipotential between the data lines DL and the gate lines GL may be eliminated by removing some part of the active layer that overlaps the gate dummy line 132 but does not overlap the data lines DL or some part of the second equipotential line 138b.

Also, a plurality of data lines DL connected to a data shorting bar are automatically cut and separated from the data shorting bar the data shorting bar during a subsequent process, i.e., a cell scribing process. In the case that a data drive IC is mounted by the COF (Chip-On-Film) method, the data lines DL are connected to a single data shorting bar. However, the present invention is not limited to this structure, and the data lines DL may be grouped into a plurality of driving blocks COG Block by the COG (Chip-On-Glass) method, as is the case for the gate lines GL, so that the data lines are configured in the same way as the gate lines within each driving block are connected by the gate shorting bars.

Accordingly, the data lines do not remain equipotential anymore since the data shorting bar is cut through the cell scribing process. As a result, the data lines DL individually receive a signal.

The removal of part of conductive lines corresponding to a cell scribing line may be performed by a trimming process using laser radiation or various types of physical scribing processes.

Once the data lines DL are insulated from the gate dummy line 132 by eliminating the second equipotential line 138b, the equipotential between the gate lines GL and the data lines DL may be eliminated. Even if the data lines DL and the gate dummy line 132 are disconnected, the data lines may have an unintended electric effect as long as the data lines DL remains connected to the data shorting bar.

For this reason, the data shorting bar creating an equipotential between the data lines DL may be removed by a cell scribing process or trimming process for more stable driving of the display device.

Accordingly, the equipotential between the driving blocks COG Block, between the gate lines, between the data lines, or between the gate lines and the data lines may be eliminated since the first and second equipotential lines of the display device are cut and separated from the gate lines GL and the data lines DL.

By forming equipotential lines between driving blocks including a plurality of gate lines by using the same metal layer as the gate lines, the present invention allows for various display fabrication processes or display tests, while there is an equipotential between at least two driving blocks, which is created through equipotential lines that electrically connect output pads electrically connected to shorting bars within each driving block and the shorting bars within at least two driving blocks before the equipotential lines are cut. Thus, any charge difference between the driving blocks that may be generated during the display fabrication process can be reduced, thereby allowing the thin film transistors of the display device to have more uniform device characteristics.

Moreover, the present invention eliminates any charge difference between the gate lines and the data lines since an equipotential is created between the gate lines and the data lines within the driving blocks by forming equipotential lines by connecting a conductive active layer portion, which lies under a plurality of data lines to a gate dummy line that constitutes the last driving block and extends from the gate shorting bars for connecting two opposite ends of the gate lines. This decreases the possibility of leaving floating or organic impurities on top of the gate lines made of the same metal layer or on overlapping portions between the gate lines and the data lines, i.e., the source and drain electrodes, which are made of different metal layers, during the process steps, thereby greatly reducing impurity defects.

While the exemplary embodiments of the present disclosure have been described with reference to the accompanying drawings, it can be understood by those skilled in the art that the present disclosure may be implemented as other specific forms without changing the technical spirit and essential characteristics.

Accordingly, it should be understood that the exemplary embodiments described above is illustrative and not restrictive in terms of all aspects, the scope of the present disclosure and the description are defined by the appended claims, and it should be interpreted that the meanings and scope of the claims, and all changed or modified forms that derived from equivalent concepts of the claims are included in the scope of the present disclosure.

What is claimed is:

1. A display device comprising:
a plurality of driving blocks comprising a plurality of gate lines and a gate shorting structure spaced apart from the gate lines as a trimming region;
an equipotential line extending from one of the plurality of driving blocks to an adjacent driving block, part of which is removed as the trimming region;
a gate dummy line extending from at least one of the plurality of driving blocks, part of which is removed as the trimming region; and
a plurality of data lines intersecting the plurality of gate lines,
wherein the gate dummy line partly overlaps the plurality of data lines, and
wherein the gate dummy line is insulated from each data line due to an opening that prevents electrical connection therebetween.

2. The display device of claim 1, wherein the equipotential line is made of a same material as the plurality of gate lines.

3. The display device of claim 1, wherein the plurality of driving blocks are insulated from each other.

4. The display device of claim 1, wherein the plurality of data lines are insulated from the gate dummy line.

5. The display device of claim 1, further comprising an active layer between the gate dummy line and each data line.

6. The display device of claim 5, wherein the active layer is made of an oxide semiconductor material that can be made conductive.

7. The display device of claim 6, wherein two ends of the active layer that are exposed and separated apart by the opening are conductive.

8. The display device of claim 7, wherein the conductive two ends of the active layer are formed through plasma treatment.

9. The display device of claim 7, wherein the conductive two ends of the active layer results from removal of a portion of the active layer therebetween.

10. A display device comprising:
a plurality of gate lines grouped into a plurality of driving blocks;
a plurality of data lines intersecting with the plurality of gate lines;
a connection line between two adjacent driving blocks; and
a gate dummy line extending from at least one of the plurality of driving blocks in a direction perpendicular to the plurality of data lines,
wherein the plurality of gate lines grouped into the plurality of driving blocks, the connection line, and the gate dummy line have an interrelated configuration to minimize effects from electrical charges generated during various steps of a fabrication process for the display device,
wherein the interrelated configuration results from disconnecting certain portions between the plurality of gate lines grouped into the plurality of driving blocks, the connection line, and the gate dummy line, which were interconnected in an equipotential manner during the fabrication process.

11. The display device of claim 10, wherein the plurality of driving blocks include at least one gate shorting structure spaced apart from the gate lines.

12. The display device of claim 11, wherein the gate shorting structure is spaced apart from the gate dummy line.

13. The display device of claim 10, further comprising an active layer between the gate dummy line and each data line, wherein two ends of the active layer that are exposed and separated apart by an opening have conductive characteristics.

14. The display device of claim 10, a first part of the gate dummy line is parallel with the plurality of gate lines.

15. The display device of claim 14, the first part of the gate dummy line extends outside of the plurality of driving blocks.

* * * * *